United States Patent [19]

Nakata

[11] Patent Number: 5,515,015
[45] Date of Patent: May 7, 1996

[54] TRANSCEIVER DUPLEX FILTER UTILIZING SAW FILTER

[75] Inventor: Izumi Nakata, Hyogo, Japan

[73] Assignee: Mitsubishi Denki Kabushiki Kaisha, Tokyo, Japan

[21] Appl. No.: 350,037

[22] Filed: Nov. 28, 1994

Related U.S. Application Data

[63] Continuation of Ser. No. 73,672, Jun. 8, 1993, abandoned.

[30] Foreign Application Priority Data

Jun. 18, 1992 [JP] Japan .................................. 4-159298

[51] Int. Cl.⁶ ........................................................ H03H 7/46
[52] U.S. Cl. ........................ 333/132; 333/193; 333/133; 333/134
[58] Field of Search .................................. 333/125, 126, 333/132, 133, 134, 202, 193–196; 455/82, 83; 370/36, 38

[56] References Cited

U.S. PATENT DOCUMENTS

| | | | |
|---|---|---|---|
| 4,464,639 | 8/1984 | Staples | 333/193 |
| 4,733,207 | 3/1988 | Peach | 333/193 |
| 4,734,664 | 3/1988 | Hikita et al. | 333/193 |
| 4,910,481 | 3/1990 | Sasaki et al. | 333/134 |
| 4,954,796 | 9/1990 | Green et al. | 333/206 |
| 5,015,973 | 5/1991 | Kawakami et al. | 333/206 |
| 5,170,500 | 12/1992 | Broderick | 455/315 |

FOREIGN PATENT DOCUMENTS

| | | | |
|---|---|---|---|
| 0085180 | 8/1983 | European Pat. Off. . | |
| 0355973 | 2/1990 | European Pat. Off. | 455/83 |
| 0194615 | 11/1982 | Japan . | |
| 0214625 | 9/1986 | Japan | 455/83 |
| 149301 | 2/1989 | Japan . | |
| 1112801 | 5/1989 | Japan . | |
| 0029109 | 1/1990 | Japan | 333/133 |
| 0020111 | 1/1990 | Japan | 333/133 |
| 289439 | 3/1990 | Japan . | |
| 2132938 | 5/1990 | Japan . | |
| 2179083 | 7/1990 | Japan . | |
| 2211701 | 8/1990 | Japan . | |
| 3249847 | 11/1991 | Japan . | |

*Primary Examiner*—Benny Lee
*Assistant Examiner*—Darius Gambino
*Attorney, Agent, or Firm*—Rothwell, Figg, Ernst & Kurz

[57] ABSTRACT

A miniaturized portable telephone is provided in which a receiving radio-frequency filter is formed by a SAW filter, while a transmitting radio-frequency filter is formed by a dielectric filter and they are mounted on a substrate. The transmitting and receiving sides are connected to an antenna by transmission lines, the length of which is set to have a high impedance in the mutual transmitting and receiving frequency.

4 Claims, 7 Drawing Sheets

5,515,015

TRANSCEIVER DUPLEX FILTER UTILIZING SAW FILTER

This is a continuation of application Ser. No. 08/073,672, filed Jun. 8, 1993 now abandoned.

BACKGROUND OF THE INVENTION

1. Field of the Invention

This invention relates to a miniaturized composite duplex filter for a radio communication equipment.

2. Description of the Prior Art

It is known in general to one skilled in the art that a dielectric filter is used for a duplexer of a radio communication equipment of a mobile phone and a portable telephone. Such a conventional dielectric filter has been designed to have a large cubic volume and occupy the greater part of the miniaturized radio communication equipment. The dielectric duplexer is basically composed of a band-pass filter at a receiving part and a band-pass filter or band-elimination filter at a transmission part.

FIG. 21 is one example of such a conventional dielectric duplexer which has been disclosed in U.S. Pat. No. 4,954, 796. In FIG. 21, the dielectric duplexer is composed of two dielectric blocks, one being situated at the transmitting part 1 and the other being at the receiving part 8, and a transmission line connecting an output terminal of a transmitting dielectric filter and an input terminal of a receiving dielectric filter to an antenna terminal 7 is arranged to use striplines 9 and 10 on a mounting substrate, each length of which is set to have a high impedance in the mutual transmitting and receiving frequency.

As described above, the conventional duplexer has been made by a dielectric filter consisting of a plurality of dielectric resonators for the transmission and reception. For example, the transmitting duplex filter is provided with four steps of resonators, while the receiving duplex filter is provided with five steps of resonators respectively. As a radius of the dielectric resonator is in inverse proportion to an insertion loss of the filter, it was necessary for the radius of the dielectric resonator to be increased to make the insertion loss small and as a result, it has a disadvantage in that the shape must be increased accordingly. Finally, the reduction of the insertion loss means the increase of the shape of the dielectric filter and it is difficult to attain the miniaturization of said dielectric filter.

SUMMARY OF THE INVENTION

It is therefore an object of the present invention to provide a SAW dielectric composite duplexer which is provided with a small and light surface acoustic wave (SAW) filter at the receiving part of the composite duplexer in order to solve the problem of the limit in the shape of the dielectric composite duplexer described above.

To solve the problem of miniaturization of the duplexer, according to the present invention, a SAW filter is newly employed for a receiving filter of the duplexer of a radio communication equipment. The SAW filter for its small, light and thin characteristics is used as a composition of a duplex filter.

In the SAW filter and dielectric filter composite duplexer according to the present invention, its duplexer is miniaturized by adopting a small and light SAW filter and besides the cubic volume and mass thereof are reduced to be less than a half of those of the conventional dielectric duplexer.

The above and other objects, features and advantages of the invention will become more apparent from the following description when taken in conjunction with the accompanying drawings, in which:

DESCRIPTION OF THE PREFERRED EMBODIMENT

FIRST EMBODIMENT

Figure 1:
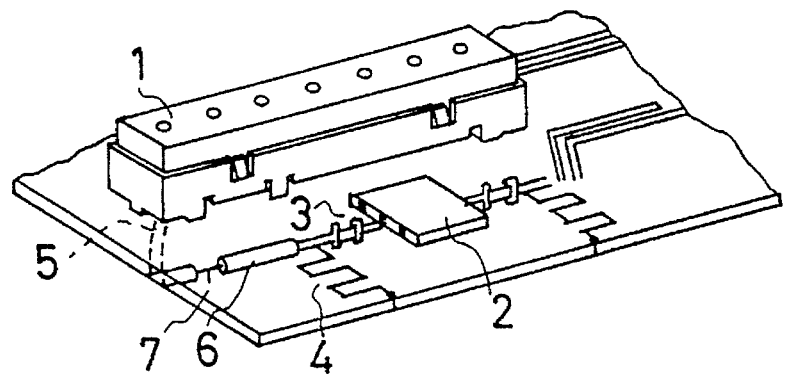
FIG. 1 is a perspective view showing a SAW filter and dielectric filter composite duplexer according to a first embodiment of the present invention.

A first embodiment of the present invention will be described hereinafter with reference to FIG. 1. A duplexer of 800 MHz band employed in a mobile phone and a portable telephone will now be described. As shown in the drawing, a SAW filter is used here for the purpose of miniaturization of the filter. As a transmission output for a radio communication equipment is usually high about 0.6 W and the SAW filter, the maximum permissible power of which is less, is not bearable against such a high output, the SAW filter is only used at the receiving side at present. The SAW filter and dielectric filter composite duplexer according to the present invention, is mainly composed of a transmitting band-pass filter 1 and a receiving SAW filter 2 and arranged to connect them to an antenna terminal 7 by way of transmission lines 5 and 6.

Figure 2:
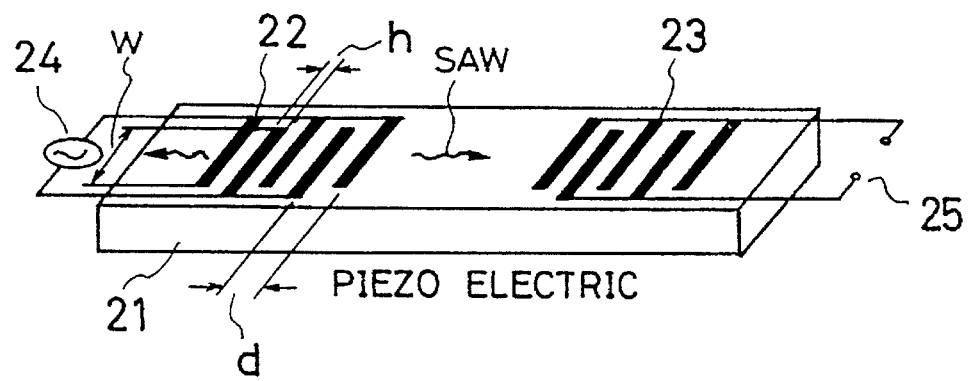
FIG. 2 is a perspective view showing the fundamentals of a SAW filter.

The fundamentals of the SAW filter will be described with reference to FIG. 2. Provided on the surface of a piezoelectric substrate 21 are a transmitting comb electrode 22 and a receiving comb electrode 23. When a high-frequency electric field 24 is impressed on the transmitting comb electrode 22, a surface acoustic wave (SAW) is generated through the agency of a piezo-electric to propagate the piezo-electric. Then the surface acoustic wave (SAW) reached the receiving comb electrode 23 is converted through the agency of the piezo-electric to a high-frequency electric field and fetched from an output terminal 25. The frequency characteristics are determined by the distance d, height h and mutual width w between the two comb electrodes.

Figure 3:
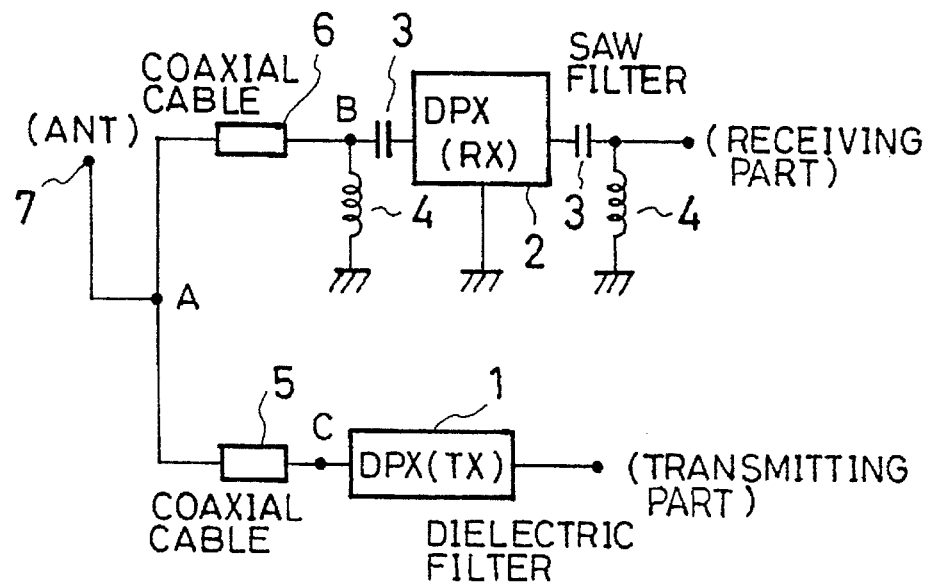
FIG. 3 is a circuit diagram showing the SAW filter and dielectric filter composite duplexer according to the present invention.

A production method of the SAW filter and dielectric filter composite duplexer is then explained hereunder with reference to FIG. 3. To function as the duplexer, in the transmitting frequency band, the transmitting dielectric filter 1 must be a low impedance, while the receiving SAW filter 2 must be a high impedance. In addition, in the receiving frequency band, the receiving SAW filter 2 must be a low impedance, while the transmitting dielectric filter 1 must be a high impedance.

Figure 6:
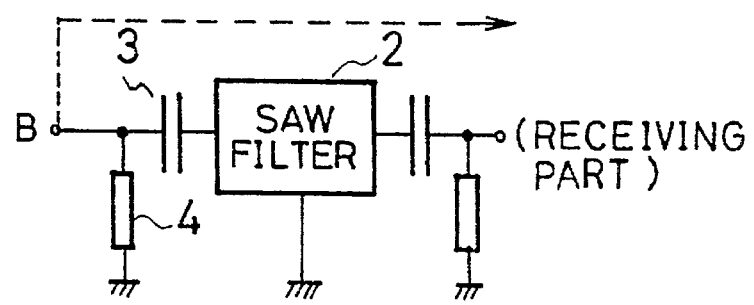
FIG. 6 is a circuit diagram as viewed from the point B of FIG. 3 in the direction of a receiving part.

First, as the SAW filter 2 has not been matched to the impedance 50 Ω, it is connected at its both ends to a coil 4 and a capacitor 3 to match the impedance 50 Ω at a point B. FIG. 6 is a circuit diagram as seen from a point B of FIG. 3 in the direction of the SAW filter 2. The impedance of the SAW filter side measures from a point B of the direction of the SAW filter 2. A receiving band is arranged to be within VSWR 2 on a Smith chart. The Smith chart after the matching of the SAW filter 2 is shown in FIG. 4.

Figure 4:
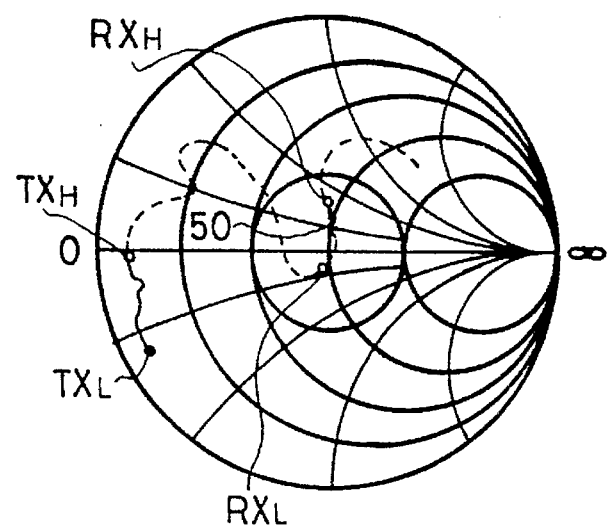
FIG. 4 is a Smith chart showing an impedance before matching at the impedance of the SAW filter.

In FIG. 4, $TX_H$ and $TX_L$ show a maximum and minimum impedance in the transmitting frequency band, while $RX_H$ and $RX_L$ show a maximum and minimum impedance in the receiving frequency band respectively.

Figure 5:
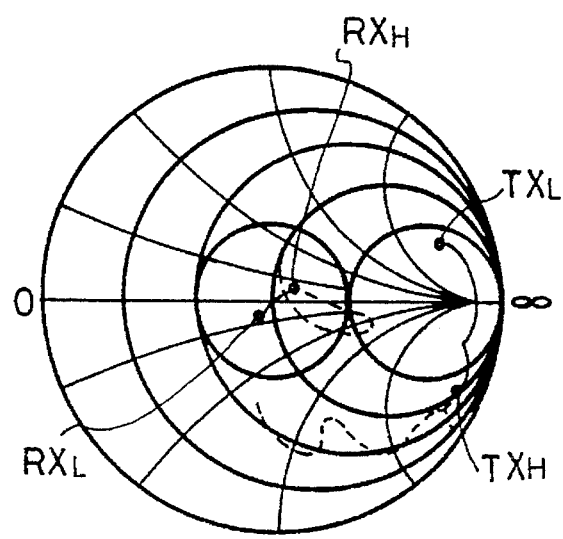
FIG. 5 is a Smith chart showing an impedance after matching at the impedance of the SAW filter.
Figure 7:
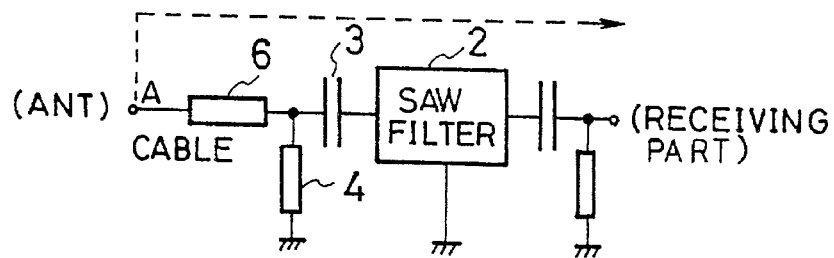
FIG. 7 is a circuit diagram as viewed from the point A of FIG. 3 in the direction of the receiving part.

The receiving SAW filter shall present a high impedance toward the transmitting frequency band ($TX_L$ to $TX_H$). Next, while a length of coaxial cable 6 is matched the impedance so that the transmitting band of a wave entering the SAW filter can be open point at a connecting point A. And a phase on the Smith chart is rotated to have such a condition as shown in FIG. 5. Namely, it is required to locate the impedance $TX_H$ and $TX_L$ to be an open point on the Smith chart. This condition shows FIG. 7. FIG. 7 is a circuit diagram as seen from the point A of FIG. 3 in the direction of the SAW filter 2.

Figure 8:
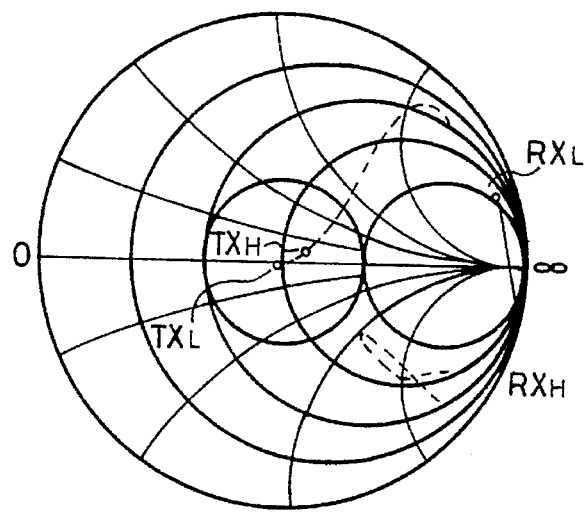
FIG. 8 is a Smith chart after connecting a coaxial cable to the transmitting side.
Figure 9:
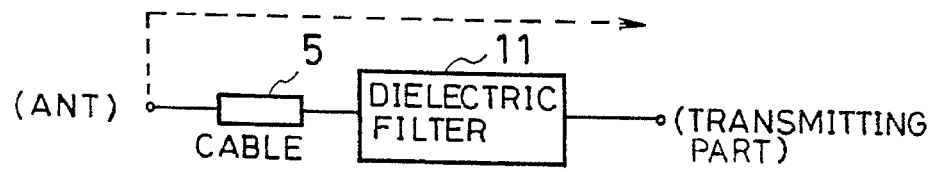
FIG. 9 is a circuit diagram after connecting a coaxial cable to the transmitting side.

Referring now to the transmitting dielectric filter, as it has been already matched to the impedance 50 Ω, the matching by such a coil and capacitor as described on the SAW filter is no more necessary, but the length of a coaxial cable 5 is required to matched the impedance so that the receiving band at the connecting point A can be represented by an open point on the Smith chart. In the same way as it has been explained above for the receiving SAW filter. FIG. 8 shows a representation on the Smith chart of the impedance variation of the transmitting dielectric filter. FIG. 9 is a circuit diagram as seen from the antenna terminal towards the dielectric filter. Finally, two coaxial cables are connected to each other at the point A which becomes the antenna terminal 7, wherein a SAW filter and dielectric filter composite duplexer is formed. It is to be noted that the duplexer incorporated with the SAW filter is reduced to be about one third in both a cubic volume and weight compared with the conventional duplexer, which is very effective in the miniaturization thereof.

SECOND EMBODIMENT

Figure 10:
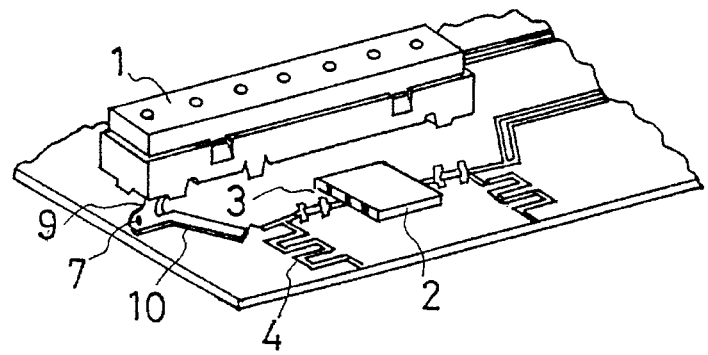
FIG. 10 is a perspective view showing a second embodiment of the present invention.

Another embodiment of the present invention will be described below with reference to FIG. 10. The SAW filter 2 is connected at its both ends to coils 4 and capacitors 3 for impedance matching and it is designed to function as a receiving duplex filter. A dielectric filter 1 is used to function as a transmitting duplex filter. Two striplines 9 and 10 of predetermined length on the substrate are provided to suppress the effect by the impedance in the mutual frequency band and a SAW filter and dielectric filter composite duplexer in the radio communication equipment part is formed by connecting the receiving and transmitting duplex filters to an antenna terminal 7. The length of striplines is arranged to have a high impedance at mutual transmitting and receiving frequency. Furthermore, the striplines have advantages in that they are more constant in quality and cheaper in price compared with the coaxial cables.

THIRD EMBODIMENT

Figure 11:
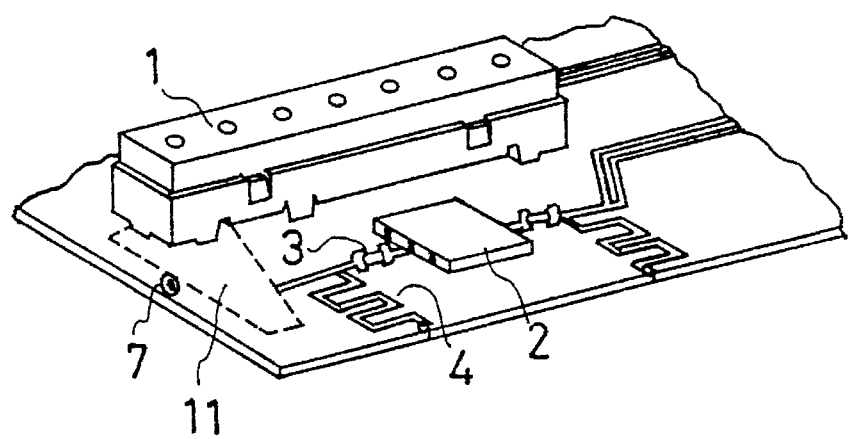
FIG. 11 is a perspective view showing a third embodiment of the present invention.

A third embodiment as shown in FIG. 11 has the same filter matching as the first embodiment and is provided with a matching circuit 11 which combines coils, capacitors and resistors as a transmission line connecting each of filters 1 and 2 to an antenna terminal 7 in place of the striplines 9 and 10 as described above.

FOURTH EMBODIMENT

Figure 12:
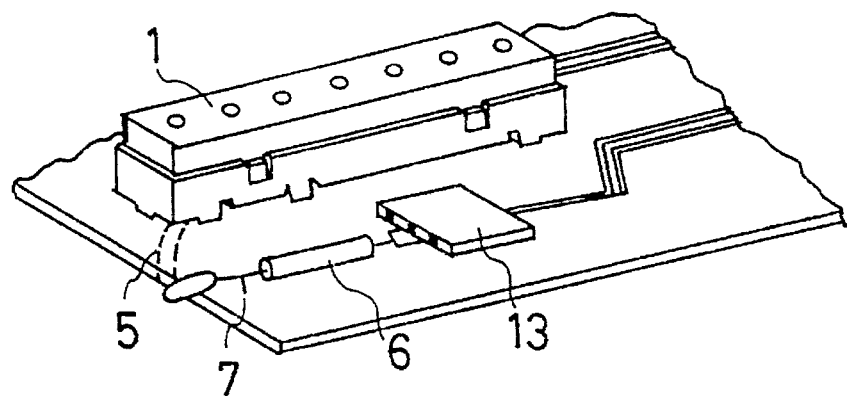
FIG. 12 is a perspective view showing a fourth embodiment of the present invention.

If the SAW filter 13 has an impedance which has been initially set to 50 Ω, the matching by the coil and capacitor is not necessary. This embodiment is shown in FIG. 12. A dielectric filter 1 is used at the transmitting side. The SAW filter and dielectric filter composite duplexer is formed by connecting these filters by the coaxial cables 5 and 6.

FIFTH EMBODIMENT

Figure 13:
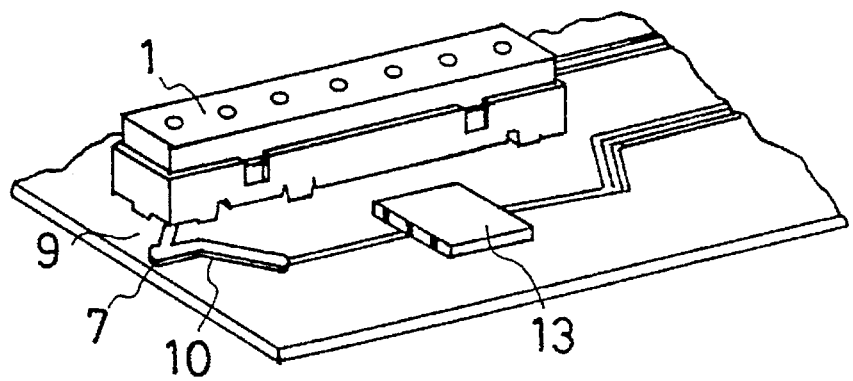
FIG. 13 is a perspective view showing a fifth embodiment of the present invention.

The SAW filter 13 with 50 Ω is used in the same manner as the fourth embodiment. By connecting the striplines 9 and 10 for the transmitting and receiving portions, the SAW filter and dielectric filter composite duplexer is formed. FIG. 13 shows this embodiment.

SIXTH EMBODIMENT

Figure 14:
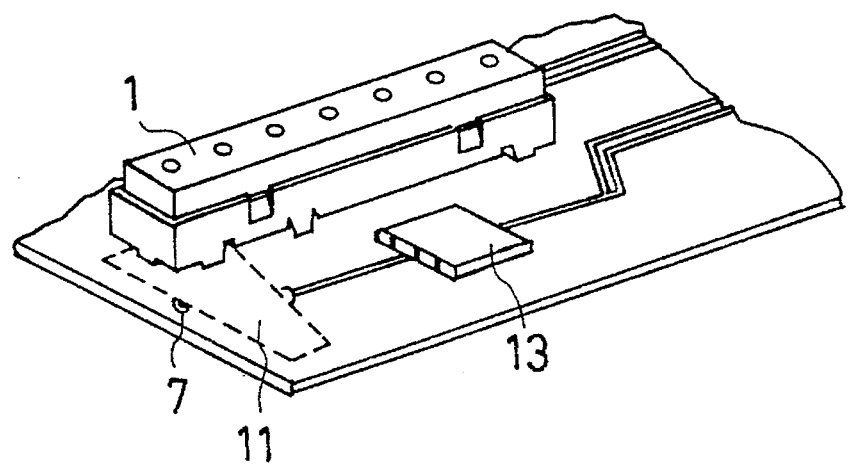
FIG. 14 is a perspective view showing a sixth embodiment of the present invention.

In the same manner as the fifth embodiment, the SAW filter 13 of 50 Ω is used. The transmitting and receiving parts form the SAW filter and dielectric filter composite duplexer which is connected by a matching circuit 11. This embodiment is shown in FIG. 14.

Figure 15:
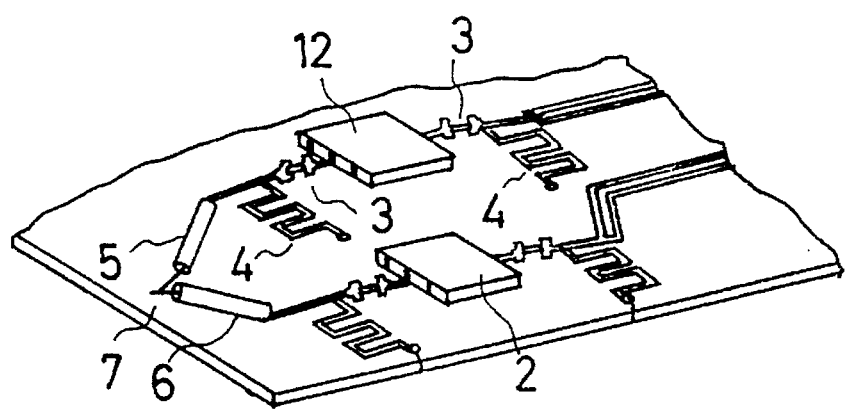
FIG. 15 is a perspective view showing a composite duplexer with the transmitting and receiving SAW filters and their connection to the antenna terminal through a matching circuits.

Although the SAW filter, according to the first through sixth embodiments, is provided only at the receiving side, it is also possible to arrange the SAW filters at both transmitting and receiving sides as shown in FIG. 15. In this case, the transmitting SAW filter must be made to bear the transmitting output. Impedance matching is made by connecting coils 4 and capacitors 3 to both sides of filters respectively for both transmission and reception. The coaxial cables 5 and 6 are provided at parts connecting each filter, and an antenna terminal 7 is formed by connecting the transmitting and receiving ends which further forms the SAW duplexer in the parts of the radio communication equipment.

Figure 16:
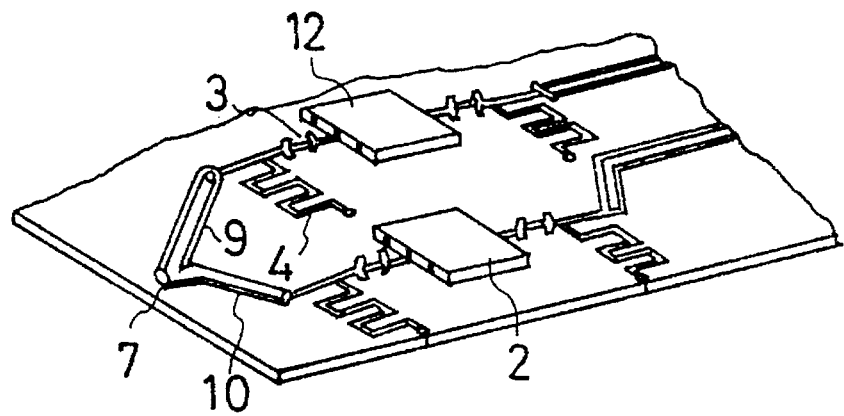
FIG. 16 is a perspective view showing the composite duplexer with the transmitting and receiving SAW filters and their connection to the antenna terminal through a matching circuits.

As shown in FIG. 16, the striplines 9 and 10 on the substrate may be used at the portion connecting each filter to the antenna terminal 7.

Figure 17:
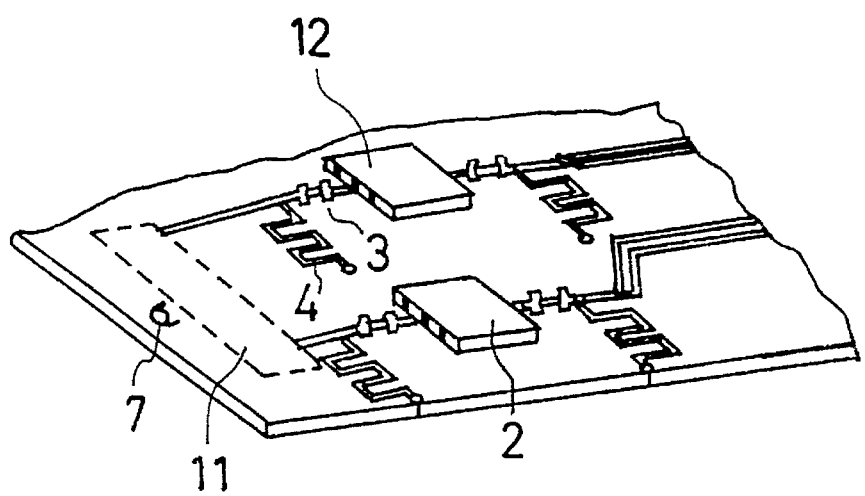
FIG. 17 is a perspective view showing the composite duplexer with the transmitting and receiving SAW filters and their connection to the antenna terminal through a matching circuits.

In FIG. 17, it is shown that a matching circuit 11 which combines coils, capacitors and resistors is provided at a portion connecting each filter to the antenna terminal 7 so as to form the SAW duplexer.

Figure 18:
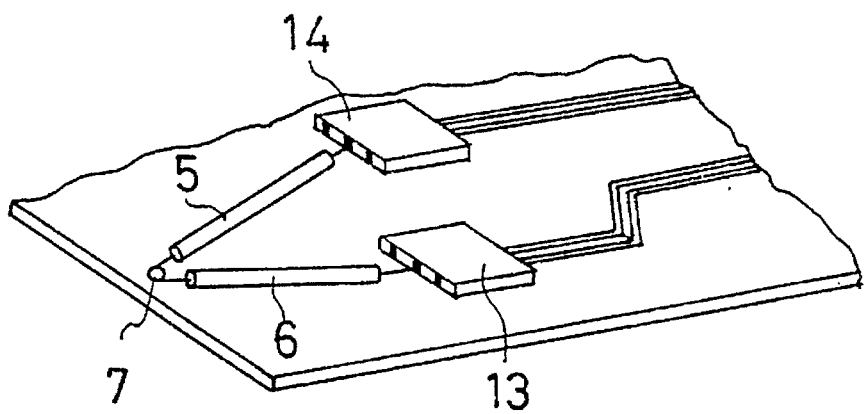
FIG. 18 is a perspective view showing the composite duplexer with the transmitting and receiving 50 Ω SAW filters and their connection to the antenna terminal through a matching circuits.

Referring now to FIG. 18, the SAW filter 13 and 14 in which the impedance has been set to 50 Ω from the beginning, may be used at both transmitting and receiving sides. The SAW duplexer is formed by connecting the transmitting and receiving parts by coaxial cables 5 and 6.

Figure 19:
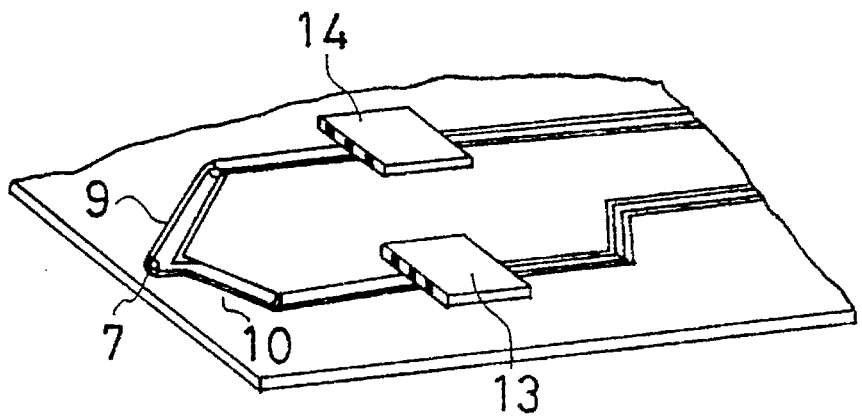
FIG. 19 is a perspective view showing the composite duplexer with the transmitting and receiving 50 Ω SAW filters and their connection to the antenna terminal through a matching circuits.

In FIG. 19, it is shown that the transmitting and receiving parts are connected by the striplines 9 and 10, using the SAW filters 13 and 14 of 50 Ω, to form the SAW duplexer.

Figure 20:
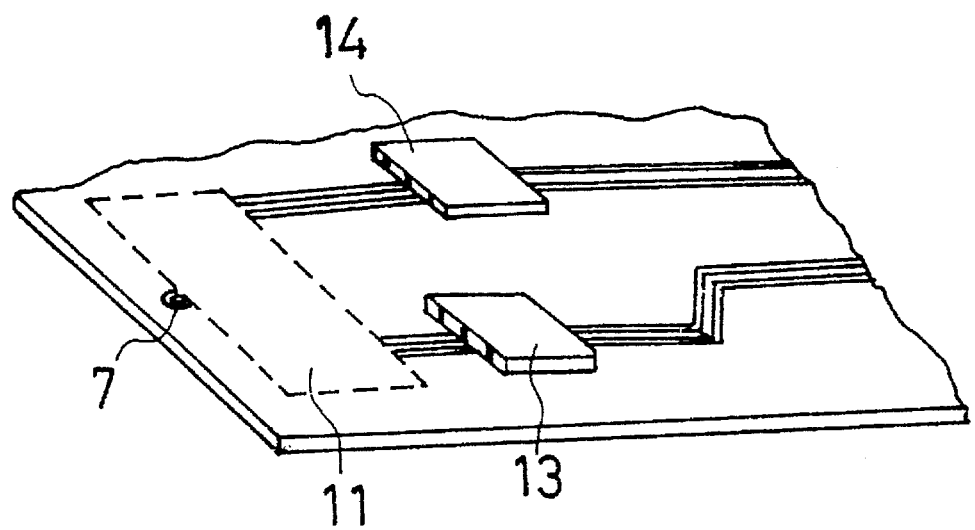
FIG. 20 is a perspective view showing the composite duplexer with the transmitting and receiving 50 Ω SAW filters and their connection to the antenna terminal through a matching circuits.
Figure 21:
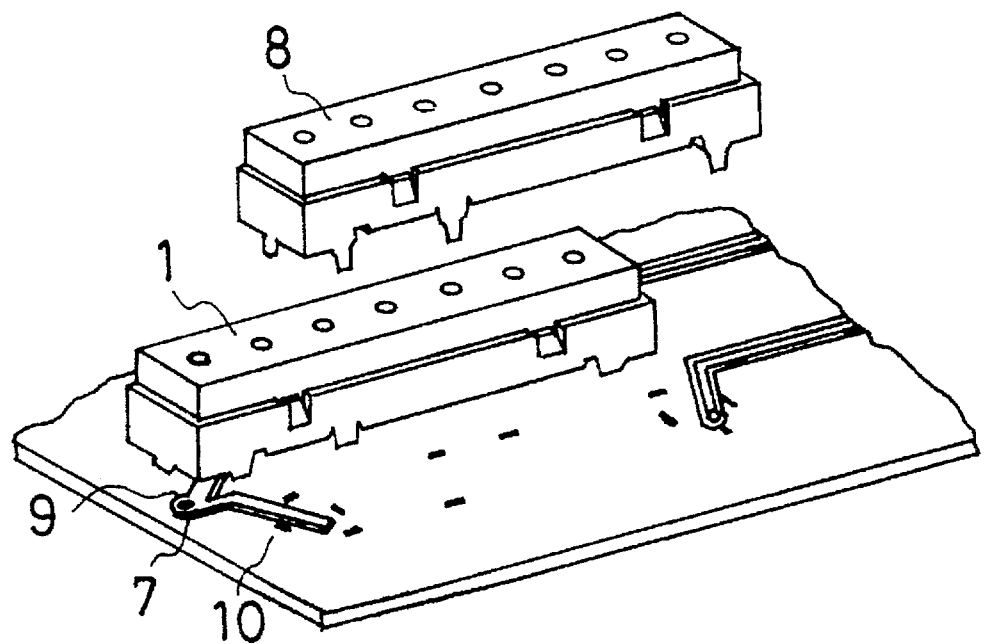
FIG. 21 is a perspective view showing the conventional dielectric duplexer.

As shown in FIG. 20, the SAW duplexer can be formed in which the transmitting and receiving parts are connected by the matching circuit 11, using the SAW filters 13 and 14 of 50 Ω.

As described above, according to the present invention, as the duplexer's receiving filter of the radio communication equipment is provided to serve as the SAW filter so as to form a SAW filter and dielectric filter composite duplexer, it has an advantage in that both of the cubic volume and weight of such duplexer are less than a half of those of the conventional duplexer and the composite duplexer can be further made at a low price.

What is claimed is:

1. A composite duplex filter for a transceiver having different transmitting and receiving frequency bands comprising:

a transmitting radio-frequency filter comprising a dielectric filter having a low impedance in the transmitting frequency band and a high impedance in the receiving frequency band;

a first transmission line provided between the transmitting radio-frequency filter and an antenna and adapted to have a low impedance in the transmitting frequency band and a high impedance in the receiving frequency band;

a receiving radio-frequency filter comprising a surface acoustic wave device having input and output end connections and a common ground and having a low impedance in the receiving frequency band and a high impedance in the transmitting frequency band; and a second transmission line provided between the receiving radio-frequency filter and said antenna and adapted to have a low impedance in the receiving frequency band and a high impedance in the transmitting frequency band;

each of the input and output end connections of said surface acoustic wave device having a capacitor connected in series therewith and with one end of said capacitor being connected to said end connection and the other end of said capacitor being connected to an inductor which is in turn connected at one end of said inductor to said capacitor and at the other end of said inductor to said common ground to provide an impedance match for said surface acoustic wave device whereby the value of the impedance looking toward said surface acoustic wave filter at each of the connections formed by said respective capacitors and inductors is about 50 ohms.

2. A composite duplex filter according to claim 1, wherein the first and second transmission lines are composed of coaxial cables.

3. A composite duplex filter according to claim 1, wherein the first and second transmission lines are composed of microwave striplines.

4. A composite duplex filter according to claim 1, wherein the first and second transmission lines are matching circuits.

* * * * *